United States Patent
Jeong et al.

(10) Patent No.: US 10,218,339 B2
(45) Date of Patent: Feb. 26, 2019

(54) VOLTAGE MONITOR WITH A TRMIMMING CIRCUIT AND METHOD THEREFORE

(71) Applicant: NXP USA, INC., Austin, TX (US)

(72) Inventors: Jae Woong Jeong, Austin, TX (US); LeRoy Winemberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/661,745

(22) Filed: Jul. 27, 2017

(65) Prior Publication Data

US 2019/0036516 A1    Jan. 31, 2019

(51) Int. Cl.
 *H03K 5/24*  (2006.01)
 *H03K 17/08* (2006.01)
 *H03K 5/007* (2006.01)

(52) U.S. Cl.
 CPC .............. *H03K 5/007* (2013.01); *H03K 5/24* (2013.01)

(58) Field of Classification Search
 CPC combination set(s) only.
 See application file for complete search history.

(56) References Cited

U.S. PATENT DOCUMENTS

| | | | |
|---|---|---|---|
| 4,827,222 A | 5/1989 | Hester et al. |
| 6,285,258 B1 | 9/2001 | Ikeuchi et al. |
| 7,433,790 B2 | 10/2008 | Anderson et al. |
| 7,812,665 B2 | 8/2010 | Eschauzier et al. |
| 2006/0276986 A1 | 12/2006 | Anderson et al. |
| 2008/0122495 A1 | 5/2008 | Boerstler et al. |
| 2013/0214946 A1 | 8/2013 | Verbruggen et al. |
| 2015/0362942 A1 | 12/2015 | Krishna et al. |

OTHER PUBLICATIONS

Mohamed, A.R., et al., "Input Offset Cancellation Trmiing Technique for Operational Amplifiers"; 2013 Saudi International Electronics, Communications and Photonics Conference; DOI: 10.1109/SIECPC.2013.6550758: Date of Conference: Apr. 27-30, 2013.

*Primary Examiner* — An T Luu

(57) ABSTRACT

An integrated circuit device includes a substrate, a voltage monitor circuit formed on the substrate, and a trimming circuit formed on the substrate that includes a successive approximation register circuit having an input coupled to an output of the voltage monitor circuit; a beta multiplier circuit having an input coupled to an output of the successive approximation register circuit, an output coupled to a first input of the voltage monitor circuit, and a variable resistance circuit. A resistance value of the variable resistance circuit is controlled by the output of the successive approximation register.

20 Claims, 2 Drawing Sheets

VOLTAGE MONITOR WITH A TRMIMMING CIRCUIT AND METHOD THEREFORE

BACKGROUND

Field

This disclosure relates generally to integrated circuits, and more specifically, to an integrated circuit having a voltage monitor with a trimming circuit.

Related Art

Analog circuitry implemented with complementary metal-oxide-semiconductor (CMOS) technology with an IC generally suffers from performance degradation. Such analog circuitry includes voltage monitors which are commonly used within integrated circuits (ICs) to monitor voltages at critical points in the IC. Voltage monitors typically have an inherent input offset due to mismatch and process variation which reduces accuracy of the monitor. Therefore, during production testing, trimming of the voltage monitor is needed to remove this inherent input offset. Currently, trimming is performed using automatic test equipment (ATE). However, testing using ATE takes a long time, which increases costs. Furthermore, integrated circuits may have multiple voltage monitors which need to each be trimmed, which leads to an even longer test time. In using an ATE for trimming, an adjustable voltage source with high accuracy is needed, along with a voltage meter and a test program to control this instrumentation, further increasing cost. Also, once an integrated circuit, or system on a chip (SoC) is released to a customer, it cannot be trimmed due. Therefore, a need exists for voltage monitors with improved trimming.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a voltage monitor with a trimming circuit is formed on-chip, within a single IC. In a trimming mode, which may be performed during manufacture or after release to a customer, a same reference voltage is applied to both the positive and negative inputs of the voltage monitor using a switch. The reference voltage is directly applied to the positive input and applied via an offset cancellation circuit to the negative input. Based on the feedback provided by the voltage monitor, a resistance value of a beta multiplier coupled to the offset cancellation circuit is changed, which changes the offset voltage provided by the offset cancellation circuit. In this manner, when the appropriate resistance value of the beta multiplier is determined that results in convergence of the positive and negative inputs of the voltage monitor. With this appropriate resistance value, the offset cancellation circuit provides an offset voltage that is the same as the inherent offset voltage of the voltage monitor, thereby cancelling the inherent offset voltage.

Figure 1:
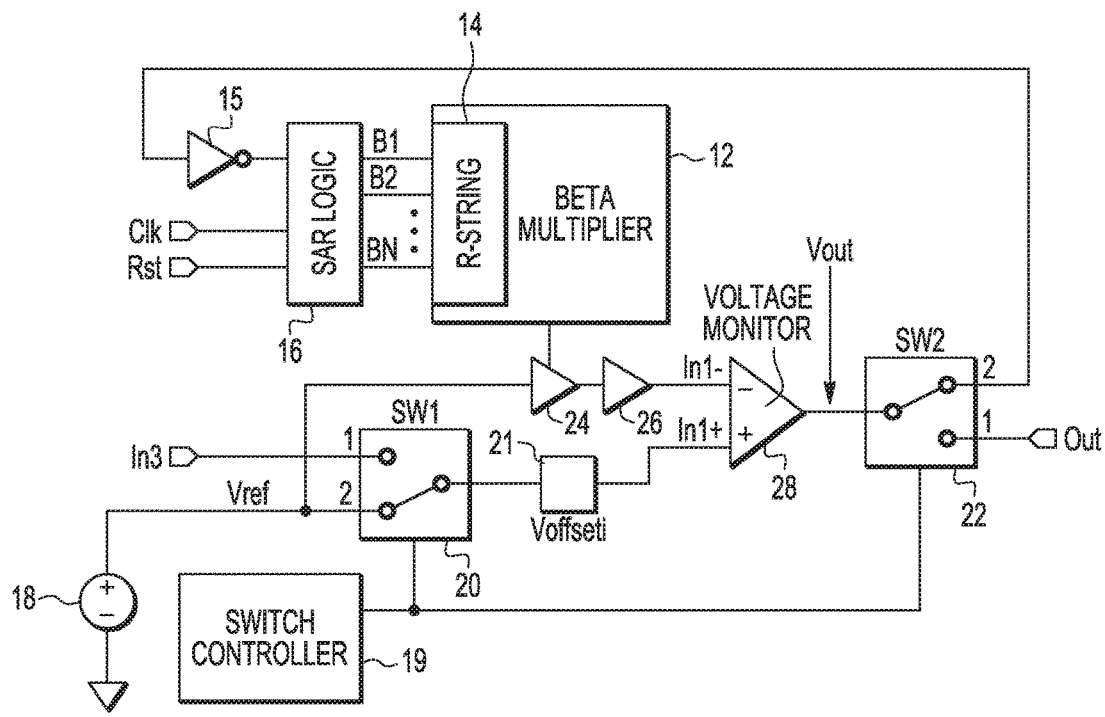
FIG. 1 illustrates, in partial block diagram and partial schematic form, an integrated circuit having a voltage monitor with a trimming circuit, in a trimming mode configuration, in accordance with one embodiment of the present invention.

FIG. 1 illustrates, in partial block diagram and partial schematic form, an integrated circuit 12 including a voltage monitor 28 and a trimming circuit which includes a successive approximation registers (SAR) logic 16, a beta multiplier 12, and buffers 24 and 26. IC 12 also includes switches 20 and 22. In the illustrated embodiment, switches 20 and 22 are single pole double throw switches, each having a first contact (labeled "1") and a second contact (labeled "2"), allowing for two different configurations. A first configuration is a trimming mode configuration in which switches 20 and 22 are set to connect to the second contact of each switch, and the second configuration is a normal operating mode (also referred to as a non-trimming mode) configuration in which switches 20 and 22 are set to connect to the first contact of each switch. FIG. 1 illustrates IC 12 in the trimming mode configuration. IC 12 also includes a switch controller 19 which includes circuitry that controls the settings of each of switches 20 and 22 to appropriately toggle between the first and second contacts for the two different configurations.

Still referring to FIG. 1, a voltage source 18 provides Vref to the second contact of switch 20, which, in trimming mode, is connected to the positive input, In1+, of voltage monitor 28. A voltage source 21 in the line connecting switch 20 with In1+ represents the inherent input voltage offset, Voffseti, introduced by voltage monitor 28. (Note that the positive input of voltage monitor 28 may be referred as the non-negating input, and the negative input may also be referred to as the negating input.) The first contact of switch 20 is connected to an input, In3, but, in trimming mode, switch 20 connects to the second contact and not the first. Therefore, In3 is not used in this mode. Vref is also coupled to an input of buffer 24, which has an output coupled to an input of buffer 26, whose output is coupled to the negative input, In1−, of voltage monitor 28. Buffers 24 and 26 may be referred to as the offset cancellation circuit. In one embodiment, buffers 24 and 26 are coupled in a source-follower configuration. Therefore, Vref is connected directly to In+, and connected via the offset cancellation circuit (via buffers 24 and 26) to In−.

The voltage at In1+ is represented by "Vref+/−Voffseti", and the voltage at In1− is represented by "Vref+/−Voffset", in which Voffset is the offset voltage provided by the offset cancellation circuit, and can be in the positive or negative direction. The output of voltage monitor 28, Vout, is provided as feedback, via switch 22 which in trimming mode is also connected to contact 2, to an input of inverter 15. An output of inverter 15 is provided to SAR logic 16. As will be described, the N-bit control value provided by the register of SAR logic 16, B1:BN, determines the number of resistors enabled in resistor string (R-string) 14 of beta multiplier 12. The number of enabled resistors determines a resistance of R-string 14, and the resistance of R-string 14 controls the output current of beta multiplier 12 provided to buffer 24. As the current provided to buffer 14 changes, the offset voltage provided by buffer 24, and thus the offset cancellation circuit, changes. Voltage monitor 28 implements a comparator such that when In1− is greater than In1+, Vout is a logic level 0, and when In1+ is greater than In1−, Vout is a logic level 1.

Figure 4:
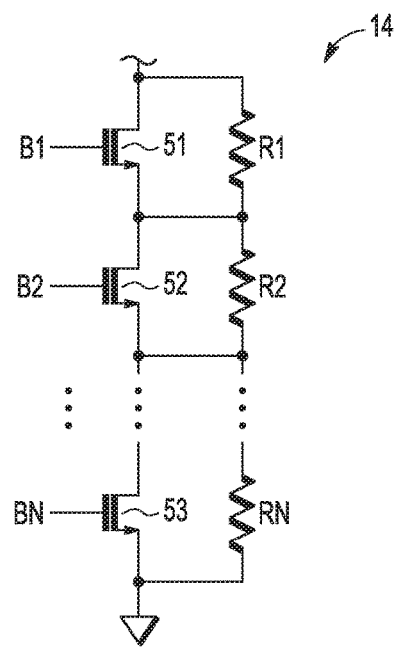
FIG. 4 illustrates, in schematic form, one embodiment of a resistor string.

FIG. 4 illustrates, in schematic form, one embodiment of R-string 14. R-string 14 is a variable resistance circuit which includes a string of resistors, R1-RN, in which each resistor can be enabled (i.e. not shorted) or disabled (i.e. shorted) by a corresponding control value of B1 to BN (stored in one or more registers of SAR logic 16). In one embodiment, each resistor is coupled in R-string 14 with a corresponding switch, such as switches 51, 52, . . . 53, which are each implemented as an n-type transistor with the corresponding resistor connected between the current electrodes of each transistor, as seen in FIG. 4. Switch 53 and RN are connected to ground. When the corresponding control value of B1-BN is a one, the corresponding resistor is shorted out from the resistor string by the corresponding switch, and when the corresponding control value of B1-BN is a zero, the corresponding resistor is not shorted out (i.e. enabled) in the resistor string by the corresponding switch such that its resistance is additive to the resistor string. In one embodiment, each resistor from RN to R1, corresponding to BN to B1, has an increasing value by a power of 2. For example, RN may be 1 ohm, R(N−1) may be 2 ohm, R(N−3) may be 4 ohm, up until R1 which may have a resistance of $2^N$ ohms. The value of each of B1 to BN is provided in turn by SAR logic 16 to enable or disable (i.e. connect or disconnect) the corresponding resistor of R1 to RN to vary the resistance of R-string 14. Each resistor can be implemented as multiple resistor elements. In alternate embodiments, other variable resistance circuitries can be used in place of R-string 14.

Referring back to FIG. 2, SAR logic 16 receives a clock signal, CLK, which can be generated from within the SoC, such as by a phase lock loop (PLL), and a reset signal, Rst. SAR logic 16 provides the value of B1 to BN, in turn, until N values are provided (in which these N values may be stored in a register of SAR logic 16). In one embodiment, N is 10 such that SAR logic 16 provides 10 control values, B1 to B10, each corresponding to one of 10 resistors in R-string 14. Therefore, a successive approximation value (also referred to as a successive control value) from B1 to B10 is provided each clock cycle of CLK. Upon entering the trimming mode, Rst is asserted to reset the value of SAR logic 16 such each of B1:B10 is zero and all 10 resistors are enabled in R-string 14. During trimming mode, the inverse of Vout, which is based on the comparison between In+ and In−, is provided by inverter 15 to SAR logic 16. With each clock cycle of CLK, SAR logic 16 determines the value of the next successive approximation value of B1:B10 (starting with B1, corresponding to the resistor of R-string 14 having the largest resistance value, to B10) using Vout. For example, if In1− is larger than In1+, Vout is 0 and SAR logic 16 provides a 0 for the next control value to short out the corresponding resistor, and if In1+ is larger than In1−, Vout is 1 and SAR logic 16 provides a 1 for the next approximation value to enable the corresponding resistor. In this manner, 10 successive approximation values for B1 to B10 are provided by SAR logic 16 to set the resistance of R-string 14, by enabling or disabling each of the 10 resistors corresponding to B1 to B10, respectively. Each iteration brings In1− closer in value to In+.

After the 10 iterations to obtain all 10 values of B1 to B10, In+ now equals In1− (with possibly a very small and negligible difference between In1− and In1+). Note that the accuracy of the convergence of In1+ with In1− depends on N, in which a greater number of control values and corresponding resistors leads to a greater accuracy. Therefore, although 10 is provided as an example for N, greater values provide greater accuracy but at a cost of greater iterations and thus greater time. With Voffset of the offset cancellation circuit set such that In1− equals In+, voltage monitor 28 is now trimmed such that the offset cancellation circuit cancels out Voffseti.

Figure 2:
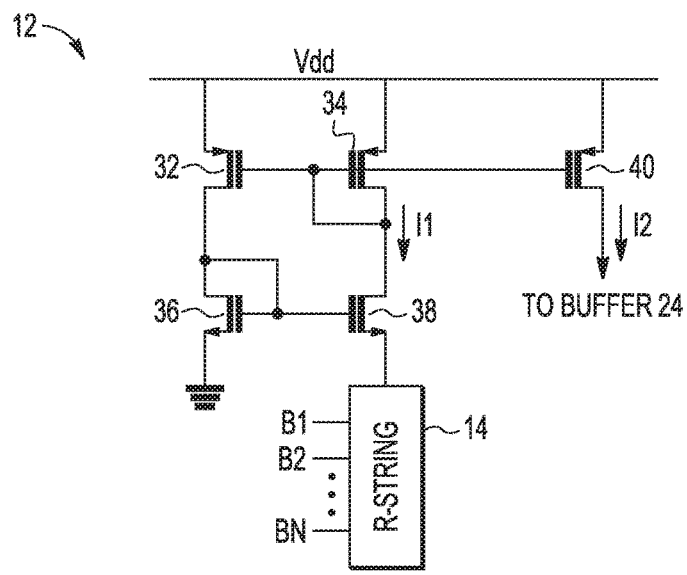
FIG. 2 illustrates, in schematic form, a beta multiplier of FIG. 1, in accordance with one embodiment of the present invention.

FIG. 2 illustrates in schematic form, beta multiplier 12 in further detail, in accordance to one embodiment of the present invention. Beta multiplier 12 includes n-type transistors 36 and 38, and p-type transistors 32, 34, and 40. A first current electrode of each of transistors 32, 34, and 40 is coupled to a first voltage supply terminal, e.g., Vdd. A control electrode of transistor 32 is coupled to a control electrode of transistor 34 and a control electrode of transistor 40. The first current electrode of transistor 34 is coupled to the control electrode of transistor 34. A first current electrode of transistor 36 is coupled to a second current electrode of transistor 32, and a second current electrode of transistor 36 is coupled to a second voltage supply terminal, e.g. ground. A first current electrode of transistor 38 is coupled to a second current electrode of transistor 34, a control electrode of transistor 38 is coupled to a control electrode of transistor 36 and the first current electrode of transistor 36, and a second current electrode of transistor 38 is coupled to switch 51 and R1 of R-string 14. A second current electrode of transistor 40 is provided to buffer 24.

Beta multiplier 12 includes a pair of stacked current mirrors, formed by transistors 32 and 34 and transistors 36 and 38. Note that any number of stacked current mirrors may be used. Based on the resistance value of R-string 14 (as determined by the control values B1:BN), a current I1 from transistor 34 to transistor 38 is mirrored by transistor 40 such that current I2 from transistor 40 to buffer 24 is proportional to I1. Therefore, a change in the resistance value of R-string 14, as determined by B1-BN, changes the value of I2 which in turn changes the value of the offset voltage provided by buffers 24 and 26.

Figure 3:
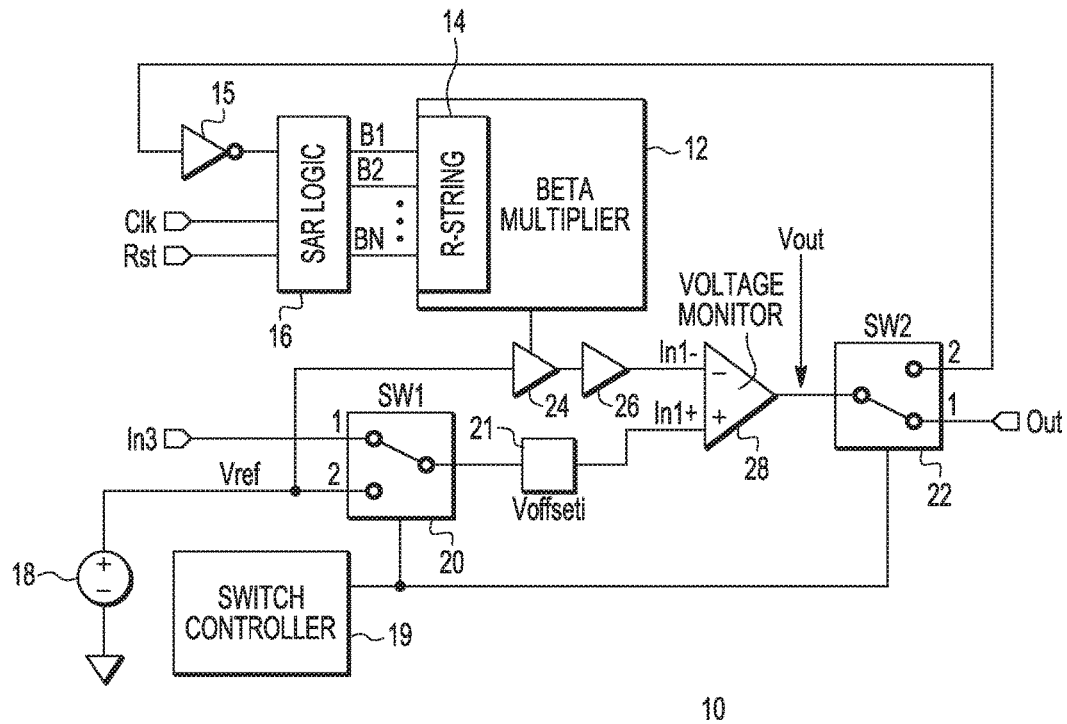
FIG. 3 in partial block diagram and partial schematic form, the integrated circuit of FIG. 1, in a normal operating mode configuration, in accordance with one embodiment of the present invention

FIG. 3 illustrates, in partial block diagram and partial schematic form, the integrated circuit 12, after trimming and in a normal operating mode configuration, in accordance with one embodiment of the present invention. During trimming mode, the offset voltage of buffers 24 and 26 is set to offset Voffseti, as described above. During normal operating mode, switches 20 and 22 are set to connect to the first contact such that an input, In3, is received at In+, rather than Vref, and Vout is provided as an output and not feedback to inverter 15. In3 corresponds to any voltage node in IC 12 (i.e. the SoC) that is to be monitored. Vref is still provided to the input of buffer 24, and the voltage at In3 is compared to Vref. Due to the offset cancellation circuit, the comparison performed by voltage monitor 28 is accurate, in spite of its inherent input offset voltage.

By now it should be appreciated that on-chip trimming circuit can be used to trim a voltage monitor to compensate for the inherent voltage offset introduced by the voltage monitor. A trimming circuit includes SAR logic, a beta multiplier with a resistor string whose value is controlled by the SAR logic, and an offset cancellation circuit controlled by the output current of the beta multiplier. During a trimming mode, the trimming circuit sets the offset voltage provided by the offset cancellation circuit. To do so, during trimming mode, a reference voltage is provided directly to In+ and is provided via the offset cancellation circuit to In−. In this manner, a separate external (off-chip) ramping voltage source is not needed. After trimming and during normal operation, the voltage monitor provides an accurate comparison with the reference voltage, due to the cancellation of its inherent voltage offset. While the trimming may be performed during manufacture to adjust the voltage monitors, since the trimming circuit is in the same IC (formed on a same IC substrate) as the voltage monitor, trimming may be performed after manufacture and release to a customer, such as during analysis in the field, by setting the switches to their trimming mode configuration.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, switches 20 and 22 may be implemented differently to allow for the trimming mode and normal operation mode configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit device includes a substrate; a voltage monitor circuit formed on the substrate; a trimming circuit formed on the substrate including a successive approximation register circuit having an input coupled to an output of the voltage monitor circuit; a beta multiplier circuit having: an input coupled to an output of the successive approximation register circuit, an output coupled to a first input of the voltage monitor circuit, and a variable resistance circuit, wherein a resistance value of the variable resistance circuit is controlled by the output of the successive approximation register. In one aspect, the integrated circuit device further includes a first buffer having a current input node coupled to the output of the beta multiplier circuit; and a second buffer having an input connected to an output of the first buffer, and an output coupled to the first input of the voltage monitor circuit. In another aspect, the integrated circuit device further includes a first switch configured to couple the output of the voltage monitor circuit to the input of the successive approximation register circuit only during a trimming mode. In another aspect, the integrated circuit device further includes a second switch configured to couple a reference voltage supply to a second input of the voltage monitor circuit during a trimming mode. In a further aspect, the first buffer includes an input coupled to the reference voltage during the trimming mode. In another further aspect, the first switch is configured to decouple the output of the voltage monitor circuit from the input of the successive approximation register circuit and couple the output of the voltage monitor circuit to an output node during a non-trimming mode of operation; and the second switch is configured to decouple the reference voltage supply from the second input of the voltage monitor circuit and couple an input voltage to the second input of the voltage monitor circuit during a non-trimming mode of operation. In yet another aspect of this embodiment, the voltage monitor circuit is a comparator, and the first input the voltage monitor circuit is a negating input and the second input the voltage monitor circuit is a non-negating input. In another further aspect, the beta multiplier circuit further includes a first current mirror; a second current mirror coupled to the first current mirror; a voltage to current converter circuit coupled to the first current mirror, wherein the voltage to current converter circuit is coupled to the current input node of the first buffer. In yet another aspect, the variable resistance circuit includes a plurality of resistive elements coupled in series between the second current mirror and a corresponding plurality of switches operable to connect and disconnect each of the plurality of resistive elements to vary the resistance value, and the plurality of switches are controlled by the output of the successive approximation register circuit.

In another embodiment, a method of trimming offset in a voltage monitor circuit for an integrated circuit device includes during a trimming mode of operation: applying a reference voltage to a positive input of the voltage monitor circuit applying the reference voltage to a negative input of the voltage monitor circuit through a trimming circuit while the reference voltage is applied to the positive input of the voltage monitor circuit, wherein the trimming circuit includes two buffers, a successive approximation registers circuit and a beta multiplier circuit; applying a clock signal to the successive approximation registers circuit to change a resistance value of the beta multiplier circuit until voltage at the negative input of the voltage monitor circuit is equal to voltage at the positive input of the voltage monitor circuit. In one aspect, the first buffer has a current input node coupled to an output of the beta multiplier circuit and the second buffer has an input connected to an output of the first buffer, and an output coupled to the negative input of the voltage monitor circuit. In a further aspect, the method further includes during a non-trimming mode of operation: decoupling an output of the voltage monitor circuit from the trimming circuit and coupling the output of the voltage monitor circuit to an output node; and decoupling the reference voltage from the positive input of the voltage monitor circuit and coupling an input voltage to the positive input of the voltage monitor circuit. In another aspect, the voltage monitor circuit is a comparator. In yet another aspect, the beta multiplier circuit further includes converting output of a current mirror circuit from a voltage to a current in the beta multiplying circuit, where the current is coupled to a node of the first buffer. In another aspect, the method further includes changing the resistance value of the beta multiplier circuit by decoupling each of plurality of resistive elements one at a time.

In yet another embodiment, an integrated circuit device includes a trimming circuit including includes two buffers, a successive approximation registers circuit and a beta multiplier circuit; a voltage monitor circuit coupled to the trimming circuit; wherein, during a trimming mode of operation, a reference voltage is coupled to a positive input of the voltage monitor circuit; the reference voltage is coupled to a negative input of the voltage monitor circuit while the reference voltage is coupled to the positive input of the voltage monitor circuit; and the successive approximation registers circuit changes a resistance value of the beta multiplier circuit over a series of clock cycles until voltage at the negative input of the voltage monitor circuit is equal to voltage at the positive input of the voltage monitor circuit. In one aspect, the first buffer has a current input node coupled to an output of the beta multiplier circuit; and the second buffer has an input connected to an output of the first buffer, and an output coupled to the negative input of the voltage monitor circuit. In a further aspect, the integrated circuit device further includes during a non-trimming mode of operation: an output of the voltage monitor circuit is decoupled from the trimming circuit and the output of the voltage monitor circuit is coupled to an output node; and the reference voltage is decoupled from the positive input of the voltage monitor circuit and an input voltage is coupled to the positive input of the voltage monitor circuit. In another aspect of the yet another embodiment, the beta multiplier circuit is configured to: convert output of current mirror circuitry from a voltage to a current, wherein the current is coupled to a node of the first buffer. In yet another aspect, the resistance value of the beta multiplier circuit is changed by decoupling each of a plurality of resistive elements one at a time during the clock cycles.

What is claimed is:

1. An integrated circuit device comprising:
 a substrate;
 a voltage monitor circuit formed on the substrate;
 a trimming circuit formed on the substrate including:
  a successive approximation register circuit having an input coupled to an output of the voltage monitor circuit;
  a beta multiplier circuit having:
   an input coupled to an output of the successive approximation register circuit,
   an output coupled to a first input of the voltage monitor circuit, and
   a variable resistance circuit, wherein a resistance value of the variable resistance circuit is controlled by the output of the successive approximation register.

2. The integrated circuit device of claim 1 further comprising:
 a first buffer having a current input node coupled to the output of the beta multiplier circuit; and
 a second buffer having an input connected to an output of the first buffer, and an output coupled to the first input of the voltage monitor circuit.

3. The integrated circuit device of claim 1 further comprising:
 a first switch configured to couple the output of the voltage monitor circuit to the input of the successive approximation register circuit only during a trimming mode.

4. The integrated circuit device of claim 1 further comprising:
 a second switch configured to couple a reference voltage supply to a second input of the voltage monitor circuit during a trimming mode.

5. The integrated circuit device of claim 4 wherein:
 the first buffer includes an input coupled to the reference voltage during the trimming mode.

6. The integrated circuit device of claim 4 wherein:
 the first switch is configured to decouple the output of the voltage monitor circuit from the input of the successive approximation register circuit and couple the output of the voltage monitor circuit to an output node during a non-trimming mode of operation; and
 the second switch is configured to decouple the reference voltage supply from the second input of the voltage monitor circuit and couple an input voltage to the second input of the voltage monitor circuit during a non-trimming mode of operation.

7. The integrated circuit device of claim 1 wherein:
 the voltage monitor circuit is a comparator, and the first input the voltage monitor circuit is a negating input and the second input the voltage monitor circuit is a non-negating input.

8. The integrated circuit device of claim 2, wherein the beta multiplier circuit further comprises:
 a first current mirror,
 a second current mirror coupled to the first current mirror;
 a voltage to current converter circuit coupled to the first current mirror, wherein the voltage to current converter circuit is coupled to the current input node of the first buffer.

9. The integrated circuit device of claim 1 wherein:
 the variable resistance circuit includes a plurality of resistive elements coupled in series between the second current mirror and a corresponding plurality of switches operable to connect and disconnect each of the plurality of resistive elements to vary the resistance value, and the plurality of switches are controlled by the output of the successive approximation register circuit.

10. A method of trimming offset in a voltage monitor circuit for an integrated circuit device comprising:
 during a trimming mode of operation:
  applying a reference voltage to a positive input of a voltage monitor circuit;

applying the reference voltage to a negative input of the voltage monitor circuit through a trimming circuit while the reference voltage is applied to the positive input of the voltage monitor circuit, wherein the trimming circuit includes two buffers, a successive approximation registers circuit and a beta multiplier circuit;

applying a clock signal to the successive approximation registers circuit to change a resistance value of the beta multiplier circuit until voltage at the negative input of the voltage monitor circuit is equal to voltage at the positive input of the voltage monitor circuit.

11. The method of claim 10 wherein:

the first buffer has a current input node coupled to an output of the beta multiplier circuit; and the second buffer has an input connected to an output of the first buffer, and an output coupled to the negative input of the voltage monitor circuit.

12. The method of claim 11 further comprising:

during a non-trimming mode of operation:

decoupling an output of the voltage monitor circuit from the trimming circuit and coupling the output of the voltage monitor circuit to an output node; and decoupling the reference voltage from the positive input of the voltage monitor circuit and coupling an input voltage to the positive input of the voltage monitor circuit.

13. The method of claim 10 wherein:

the voltage monitor circuit is a comparator.

14. The method of claim 10, wherein the beta multiplier circuit further comprises:

converting output of a current mirror circuit from a voltage to a current in the beta multiplying circuit, where the current is coupled to a node of the first buffer.

15. The method of claim 10, further comprising:

changing the resistance value of the beta multiplier circuit by decoupling each of plurality of resistive elements one at a time.

16. An integrated circuit device comprising:

a trimming circuit including includes two buffers, a successive approximation registers circuit and a beta multiplier circuit;

a voltage monitor circuit coupled to the trimming circuit;

wherein, during a trimming mode of operation, a reference voltage is coupled to a positive input of the voltage monitor circuit;

the reference voltage is coupled to a negative input of the voltage monitor circuit while the reference voltage is coupled to the positive input of the voltage monitor circuit; and the successive approximation registers circuit changes a resistance value of the beta multiplier circuit over a series of clock cycles until voltage at the negative input of the voltage monitor circuit is equal to voltage at the positive input of the voltage monitor circuit.

17. The integrated circuit device of claim 16 wherein:

the first buffer has a current input node coupled to an output of the beta multiplier circuit; and the second buffer has an input connected to an output of the first buffer, and an output coupled to the negative input of the voltage monitor circuit.

18. The integrated circuit device of claim 17 further comprising:

during a non-trimming mode of operation:

an output of the voltage monitor circuit is decoupled from the trimming circuit and the output of the voltage monitor circuit is coupled to an output node; and the reference voltage is decoupled from the positive input of the voltage monitor circuit and an input voltage is coupled to the positive input of the voltage monitor circuit.

19. The integrated circuit device of claim 16, wherein the beta multiplier circuit is configured to:

convert output of current mirror circuitry from a voltage to a current, wherein the current is coupled to a node of the first buffer.

20. The integrated circuit device of claim 16 wherein:

the resistance value of the beta multiplier circuit is changed by decoupling each of a plurality of resistive elements one at a time during the clock cycles.

* * * * *

UNITED STATES PATENT AND TRADEMARK OFFICE
CERTIFICATE OF CORRECTION

PATENT NO. : 10,218,339 B2  
APPLICATION NO. : 15/661745  
DATED : February 26, 2019  
INVENTOR(S) : Jae Woong Jeong et al.

Page 1 of 1

It is certified that error appears in the above-identified patent and that said Letters Patent is hereby corrected as shown below:

On the Title Page

The TITLE should read:
"VOLTAGE MONITOR WITH A TRIMMING CIRCUIT AND METHOD THEREFORE"

Signed and Sealed this
Seventeenth Day of September, 2019

Andrei Iancu
*Director of the United States Patent and Trademark Office*